United States Patent [19]

Bollen et al.

[11] 4,011,578

[45] Mar. 8, 1977

[54] PHOTODIODE

[75] Inventors: Lambertus Jacobus Maria Bollen; Cornelus Petrus Theodorus Maria Damen, both of Eindhoven, Netherlands

[73] Assignee: U.S. Philips Corporation, New York, N.Y.

[22] Filed: June 5, 1975

[21] Appl. No.: 584,156

[30] Foreign Application Priority Data

June 12, 1974 Netherlands ............... 7407811

[52] U.S. Cl. ............................ 357/30; 357/71; 357/67; 357/10
[51] Int. Cl.² ............... H01L 27/14; H01L 23/48
[58] Field of Search ............. 357/30, 71, 17, 19, 357/67, 10, 18, 16, 67

[56] References Cited

UNITED STATES PATENTS

| | | | |
|---|---|---|---|
| 2,965,519 | 12/1960 | Christensen | 117/217 |
| 3,416,044 | 12/1968 | Dreyfus | 317/234 |
| 3,849,707 | 11/1974 | Braslau | 357/17 |
| 3,928,864 | 12/1975 | Fertin | 357/17 |

*Primary Examiner*—Martin H. Edlow
*Attorney, Agent, or Firm*—Frank R. Trifari; Leon Nigohosian

[57] ABSTRACT

The invention relates to a photodiode having a semiconductor body comprising regions of opposite conductivity types which are separated by a p-n junction and of which at least one region has an anti-reflective layer.

The anti-reflective layer consists of tin-doped indium oxide and forms an ohmic connection with the one region.

8 Claims, 1 Drawing Figure

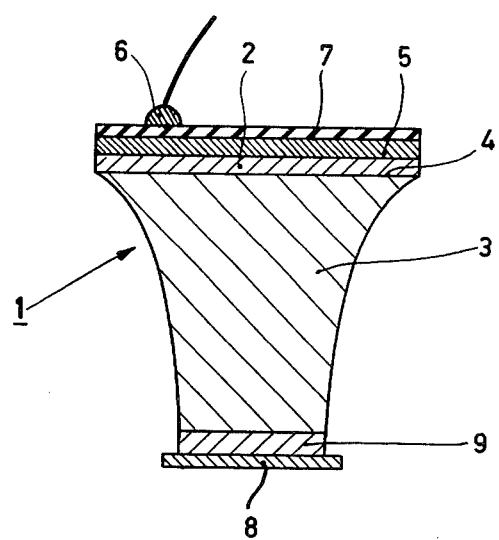

PHOTODIODE

The invention relates to a photodiode comprising a semiconductor body having regions of opposite conductivity types which are separated by a p-n junction, at least one region having an anti-reflective layer.

In photodiodes of the said kind, the material for the semiconductor body may be chosen in agreement with the requirements imposed on the photodiode and independently of the material of the anti-reflective layer. This is in contrast with photodiodes in which the anti-reflective layer forms a region of the semiconductor body.

Photodiodes of the kind mentioned in the preamble may be used as such but also, for example, as avalanche photodiodes or as solar cells.

The anti-reflective layer used in the photodiode often consists of insulating compounds, such as silicon monoxide or silicon dioxide, as a result of which the manufacture is rather complicated. Said manufacture comprises, for example, a photo-etching treatment of an anti-reflective layer provided on the region for exposing parts of the region to be contacted and subsequent steps for providing a metal layer which is to be subjected to a photoetching treatment to obtain metallic contacts. The alignment steps of the two photoetching treatments should be accurately adapted to each other.

One of the objects of the invention is to provide a construction for a photodiode whose manufacture is simpler than has been described above.

It is based on the recognition of the fact that a considerably simpler manufacture is possible when the anti-reflective layer is also electrically readily conductive.

Therefore, the photodiode mentioned in the preamble is characterized according to the invention in that the anti-reflective layer consists of tin-doped indium-oxide and forms an ohmic connection with the one region.

The photodiode according to the invention can be manufactured in a considerably simpler manner than the above described one. A tin-doped indium oxide layer may have a resistance which is lower than that of the region on which an ohmic contact is formed. Said layer need not be subjected to a photoetching step to contact the region.

The one region has a resistance per square, for example, of 30–40 ohm. If the resistance per square of the indium oxide layer is, for example, 20 ohm, a metallic contact having a small area may be used on the indium oxide layer and the surface of the one region may be used optimally.

Low resistances per square are obtained in particular when the tin content of the indium oxide layer, expressed in the weight ratio of tin to indium, is between 0.01 and 0.05, preferably between 0.015 and 0.035.

The reflection of such layers with, for example, a resistance per square of 20 ohm is 2%.

A metallic contact for the indium oxide layer is preferably separated from said layer by a bismuth oxide layer.

Due to the presence of the bismuth oxide layer a particularly good adhesion between the indium oxide layer and the metallic contact is obtained.

The bismuth oxide layer may be thin, preferably less than 500 A., and has no detrimental influence on the resistance of the contact.

When a bismuth oxide layer is used, no metal layer need by vapour-deposited so as to obtain the metallic contact and a pattern be provided therein, for example, by a photoetching treatment, but the bismuth oxide layer is preferably provided with a metallic contact of gold by thermocompression.

The one region can be obtained in a usual manner, for example, by diffusion, preferably, however, by ion implantation or epitaxy, the life of minority charge carriers not decreasing to any considerable extent.

In a method of manufacturing a photodiode according to the invention the indium oxide layer is vapour-deposited on the one region, preferably under a reduced oxygen pressure, from separate indium sources and tin sources.

The indium oxide layer is perferably provided with a bismuth oxide layer which is contacted with a wire of gold by thermocompression.

The invention will be described in greater detail with reference to an example and the accompanying drawing which is a diagrammatic sectional view of a part of a photodiode according to the invention.

Of a photodiode a semiconductor region 1 of silicon is shown in the FIGURE. The semiconductor body 1 comprises regions 2 and 3 of opposite conductivity types which are separated by a p-n junction 4. One region, namely region 2, has an anti-reflective layer 5.

According to the invention the anti-reflective layer 5 consists of a tin-doped indium oxide which forms an ohmic connection with the one region 2.

The region 3 is of the p conductivity type and the one region 2 is of the n conductivity type. The resistance per square of the one region 2 is approximately 30 ohm and that of the tin-doped indium oxide layer 5 is 20 ohm.

The weight ratio of tin to indium in the indium oxide layer 5 is 0.025.

In the embodiment shown in the FIGURE the region 2 extends on one side of the semiconductor body 1 along the whole surface and the indium oxide layer 5 has a local metallic contact 6 and is separated therefrom by a bismuth oxide layer 7 having a thickness of, for example, 100 A.

The metallic contact 6 may be formed on the bismuth oxide layer 7 by thermocompression of a gold wire.

The one region 2 is preferably formed by means of ion implantation or epitaxy.

When epitaxy is used, the region 2 is deposited in a usual manner in a thickness of 0.5 $\mu$m on the region 3 consisting of a 15 $\mu$m thick p-layer on a p$^+$-substrate 9.

The region 2 is then provided with the indium oxide layer 5 and the bismuth oxide layer 7, for example, by vapour-deposition. The substrate 9 is then etched away for the greater part and provided with a metal layer 8.

During the manufacture, the starting material may be a semiconductor wafer in which a large number of photodiodes are formed simultaneously.

The metallic contacts for the individual diodes are then formed in the metal layer 8 on the etched substrate 9, which contacts also serve as a mask for etching the semiconductor wafer into separate diodes. It will be obvious that no special alignment steps are necessary since the metallic contacts 6 are then bonded on the bismuth oxide layer 7.

The indium oxide layer is preferably provided by vapour-deposition under a reduced oxygen pressure, for example, 5 $\times 10^{-4}$ mm mercury from separate indium sources and tin sources. The indium oxide layer 5 has a thickness of, for example, 0.12 μm and a resistivity of 2 ×4.10⁻⁴ ohm. cm.

It will be obvious that the invention is not restricted to the embodiment described, but that many variations are possible to those skilled in the art without departing from the scope of this invention.

What is claimed is:

1. A photodiode, comprising: (a) a semiconductor body having regions of opposite conductivity types which are separated by a p-n junction, (b) an anti-reflective layer at, at least one region said anti-reflective layer consisting essentially of tin-doped indium oxide and forming an ohmic connection with said one region, (c) a metallic contact element disposed over said anti-reflective layer and electrically connected therewith, and, (d) a bismuth oxide layer disposed between said antireflective layer and said metallic contact element.

2. A photodiode as in claim 1, wherein the tin content of said indium oxide layer, expressed in the weight ratio of tin to indium, is between 0.01 and 0.05.

3. A photodiode as in claim 2, wherein said tin content is between 0.015 and 0.035.

4. A photodiode as in claim 1, wherein said bismuth oxide layer has a thickness less than 500 A.

5. A photodiode as in claim 1, wherein said metallic contact element is of gold and is attached to said bismuth oxide layer by thermocompression.

6. A method of manufacturing a photodiode as in claim 1, wherein said one region is formed by ion implantation or epitaxy.

7. A method of manufacturing a photodiode as in claim 1, wherein said indium oxide layer is vapor deposited on said one region from separate indium sources and tin sources under a reduced oxygen pressure.

8. A method as in claim 7, wherein said indium oxide layer is provided with a bismuth oxide layer which is contacted with a gold wire by thermocompression.

* * * * *